(12) United States Patent
Cheng et al.

(10) Patent No.: US 9,181,426 B2
(45) Date of Patent: *Nov. 10, 2015

(54) METHOD OF CONTROLLING ORIENTATION OF DOMAINS IN BLOCK COPOLYMER FILMS

(71) Applicant: International Business Machines Corporation, Armonk, NY (US)

(72) Inventors: Joy Cheng, San Jose, CA (US); Ho-Cheol Kim, San Jose, CA (US); Daniel P. Sanders, San Jose, CA (US); Linda Sundberg, Los Gatos, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 244 days.

This patent is subject to a terminal disclaimer.

(21) Appl. No.: 13/915,980

(22) Filed: Jun. 12, 2013

(65) Prior Publication Data

US 2013/0274380 A1  Oct. 17, 2013

Related U.S. Application Data

(63) Continuation of application No. 12/060,516, filed on Apr. 1, 2008, now Pat. No. 8,491,965, which is a continuation of application No. 12/013,138, filed on Jan. 11, 2008, now Pat. No. 7,763,319.

(51) Int. Cl.
*C08L 63/00* (2006.01)
*B05D 5/00* (2006.01)
(Continued)

(52) U.S. Cl.
CPC . *C08L 63/00* (2013.01); *B05D 5/02* (2013.01); *B81C 1/00031* (2013.01); *B82Y 10/00* (2013.01); *B82Y 30/00* (2013.01); *B82Y 40/00* (2013.01); *C08F 283/10* (2013.01); *C08L 53/00* (2013.01); *C09D 125/14* (2013.01); *G03F 7/0002* (2013.01); *G03F 7/038* (2013.01);
(Continued)

(58) Field of Classification Search
CPC ....... C08F 283/10; C08L 63/00; C08L 53/00; B05D 5/00; B05D 5/12
See application file for complete search history.

(56) References Cited

U.S. PATENT DOCUMENTS 6,106,998 A    8/2000  Maeda et al.
6,352,813 B2   3/2002  Nakano et al.
(Continued)

OTHER PUBLICATIONS

Guegan et al. Macromolecules 1994, 27, 4993-4997.*

(Continued)

*Primary Examiner* — Mark Kaucher
(74) *Attorney, Agent, or Firm* — Cantor Colburn LLP

(57) ABSTRACT

A method of orienting microphase-separated domains is disclosed, comprising applying a composition comprising an orientation control component, and a block copolymer assembly component comprising a block copolymer having at least two microphase-separated domains in which the orientation control component is substantially immiscible with the block copolymer assembly component upon forming a film; and forming a compositionally vertically segregated film on the surface of the substrate from the composition. The orientation control component and block copolymer segregate during film forming to form the compositionally vertically-segregated film on the surface of a substrate, where the orientation control component is enriched adjacent to the surface of the compositionally segregated film adjacent to the surface of the substrate, and the block copolymer assembly is enriched at an air-surface interface.

15 Claims, 6 Drawing Sheets

(51) Int. Cl.
| | |
|---|---|
| B05D 5/02 | (2006.01) |
| B81C 1/00 | (2006.01) |
| B82Y 30/00 | (2011.01) |
| C08F 283/10 | (2006.01) |
| G03F 7/038 | (2006.01) |
| C09D 125/14 | (2006.01) |
| C08L 53/00 | (2006.01) |
| G03F 7/00 | (2006.01) |
| B82Y 10/00 | (2011.01) |
| B82Y 40/00 | (2011.01) |

(52) U.S. Cl.
CPC ...... B81C2201/0149 (2013.01); Y10S 264/901 (2013.01); Y10S 428/91 (2013.01); Y10T 428/24942 (2015.01)

(56) References Cited

U.S. PATENT DOCUMENTS

| | | | |
|---|---|---|---|
| 6,565,763 | B1 | 5/2003 | Asakawa et al. |
| 6,746,825 | B2 | 6/2004 | Nealy et al. |
| 6,906,115 | B2 | 6/2005 | Hanazawa et al. |
| 6,926,953 | B2 | 8/2005 | Nealy et al. |
| 7,521,090 | B1 | 4/2009 | Cheng et al. |
| 7,763,319 | B2 | 7/2010 | Cheng et al. |
| 8,133,534 | B2 | 3/2012 | Stoykovich et al. |
| 2001/0021482 | A1 | 9/2001 | Nakano et al. |
| 2003/0091752 | A1 | 5/2003 | Nealey et al. |
| 2003/0118800 | A1 | 6/2003 | Thomas et al. |
| 2004/0175628 | A1 | 9/2004 | Nealey et al. |
| 2006/0078681 | A1 | 4/2006 | Hieda et al. |
| 2006/0083854 | A1 | 4/2006 | Ober et al. |
| 2006/0134556 | A1 | 6/2006 | Nealey et al. |
| 2006/0249784 | A1 | 11/2006 | Black et al. |
| 2007/0175859 | A1 | 8/2007 | Black et al. |
| 2008/0299353 | A1* | 12/2008 | Stoykovich et al. ........ 428/195.1 |
| 2009/0087664 | A1 | 4/2009 | Nealey et al. |
| 2009/0179001 | A1 | 7/2009 | Cheng et al. |
| 2009/0179002 | A1 | 7/2009 | Cheng et al. |
| 2009/0181171 | A1 | 7/2009 | Cheng et al. |
| 2013/0029113 | A1 | 1/2013 | Nealey et al. |

OTHER PUBLICATIONS

Manners, Ian, "Synthetic metal-containing polymer" Wiley-VCH, 2004.

Albrecht, T.R., "Nanoimprint Litograph for Patterned Media", IEEE Lithography Workshop, Dec. 9-14, 2007, RioGrande, Puerto Rico, p. 35.

Allen, R. et al., "High Speed, Aqueous Developing Negative Resist Based on Triflic Acid Catalysed Epoxy Polymerization", Advances in Resist Technology and Processing IX, 1992, vol. 1672, pp. 513-525.

Bang, J. et al., "Facile Routes to Patterned Surface Neutralization Layers for Block Copolymer Lithography" Advanced Materials, Nov. 28, 2007, vol. 19, Wiley-VCH Verlag GmBH & Co., Weinheim, pp. 4452-4557.

Black, C.T., "Self-aligned self assembly of multi-nanowire silicon field effect transistors", Applied Physics Letters, Oct. 13, 2005, vol. 87, 163116, 3 pgs., American Institute of Physics, Applied Physics Newsletters, [online]; [retrieved on Jan. 21, 2008]; restricted from the internet http://apl.aip.org/apl.copyright.jsp.

Chai, J. et al., "Assembly of Aligned Linear Metallic Patterns on Silicon", Nature Nanotechnology Aug. 3, 2007, vol. 2, Nature Publishing Group, pp. 500-506.

Freer, E. et al., "Oriented Mesoporous Organosilicate Thin Films", Nano Letters 2005, Aug. 2, 2005, vol. 5, No. 10, American Chemical Society, pp. 2014-2018.

Han, E. et al., "Photopatternable Imaging Layers for Controlling Block Copolymer Microdomain Orientation**", Advanced Materials, Nov. 21, 2007, vol. 19, Wiley-VCH Verlag GmBH & Co., Weinheim, pp. 4448-4452.

Han, J. et al., "Adsorption and Fractionation of RAFT-Polymerized PS-b-PMMA Block Copolymers for 2D Liquid Chromatography, "American Physical Society, APS March Meeting Abstract, 03-05/9-2007, 2 pgs. Havard University, [online]; [retrieved on Jun. 11, 2008]; retrieved from the Internet http://adsabs_harvard.edu/abs/2007APS..MARN17003H.

Lewis, Richard J. Sr. Hawley's Condensed Chemical Dictionary, Fourteenth Edition, 2002, Wiley-Interscience, term "mixture—mix".

In, I. et al., "Side-Chain-Grafted Random Copolymer Brushes as Neutral Surfaces for Controlling the Orientation of Block Copolymer Microdomains in Thin Films", Langmuir, Aug. 6, 2006, 10.1021/Ia060478g, American Chemical Society, pp. 7855-7860.

Ito, H., "Chemical Amplification Resists for Microlithography", Adv. Polym Sci, 2005, DOI 10, 1007/B97574, pp. 37-245.

Mansky, P. et al., "Controlling Polymer-Surface Interactions with Random Copolymer Brushes", Science, Mar. 7, 1997, vol. 275, pp. 1458-1460.

Park, C. et al., "Enabling nanotechnology with self assembled block copolymer patterns", Polymer, Jul. 29, 2003, 0032-3861, Elsevier, pp. 6725-6760.

Peters, R. et al., "Using Self-Assembled Monolayers Exposed to X-rays to Control the Wetting Behavior of Thin Films of Diblock Copolymers", Langmuir 2000, Feb. 18, 2000, American Chemical Society, pp. 4625-4631.

Ryu, D., et al., "A Generalized Approach to the Modification of Solid Surfaces", Science, Apr. 8, 2005, pp. 236-239.

Nealey, P., "Methods and Compositions for Forming Patterns with Isolated or4 Discrete Features Using Block Copolymer Materials", Patent Application, 76 pgs, Beyer Weaver & Thomas, LLP, Oakland, CA USA.

Lewis, Richard J. Sr., Hawley's Condensed Chemical Dictionary, Fourteenth Edition, 2002, Wiley-Interscience, term "mixture—mix".

Guegan, P. et al., "Kinetics of Chain Coupling at Melt Interfaces" Macromolecules, 1994, vol. 27, American Chemical Society; pp. 4993-4997.

* cited by examiner

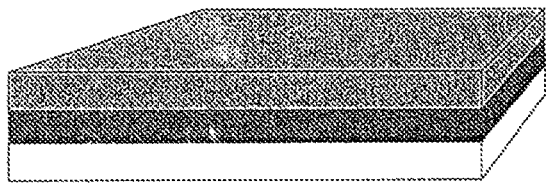
FIG. 1A
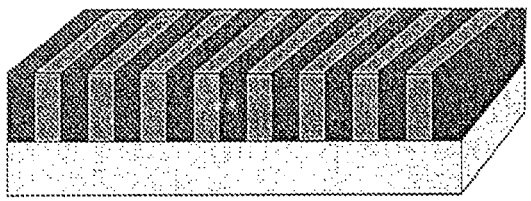
Parallel Lamellae
No Surface Patterns
FIG. 1B
Perpendicular Lamellae
Line Patterns
FIG. 1C

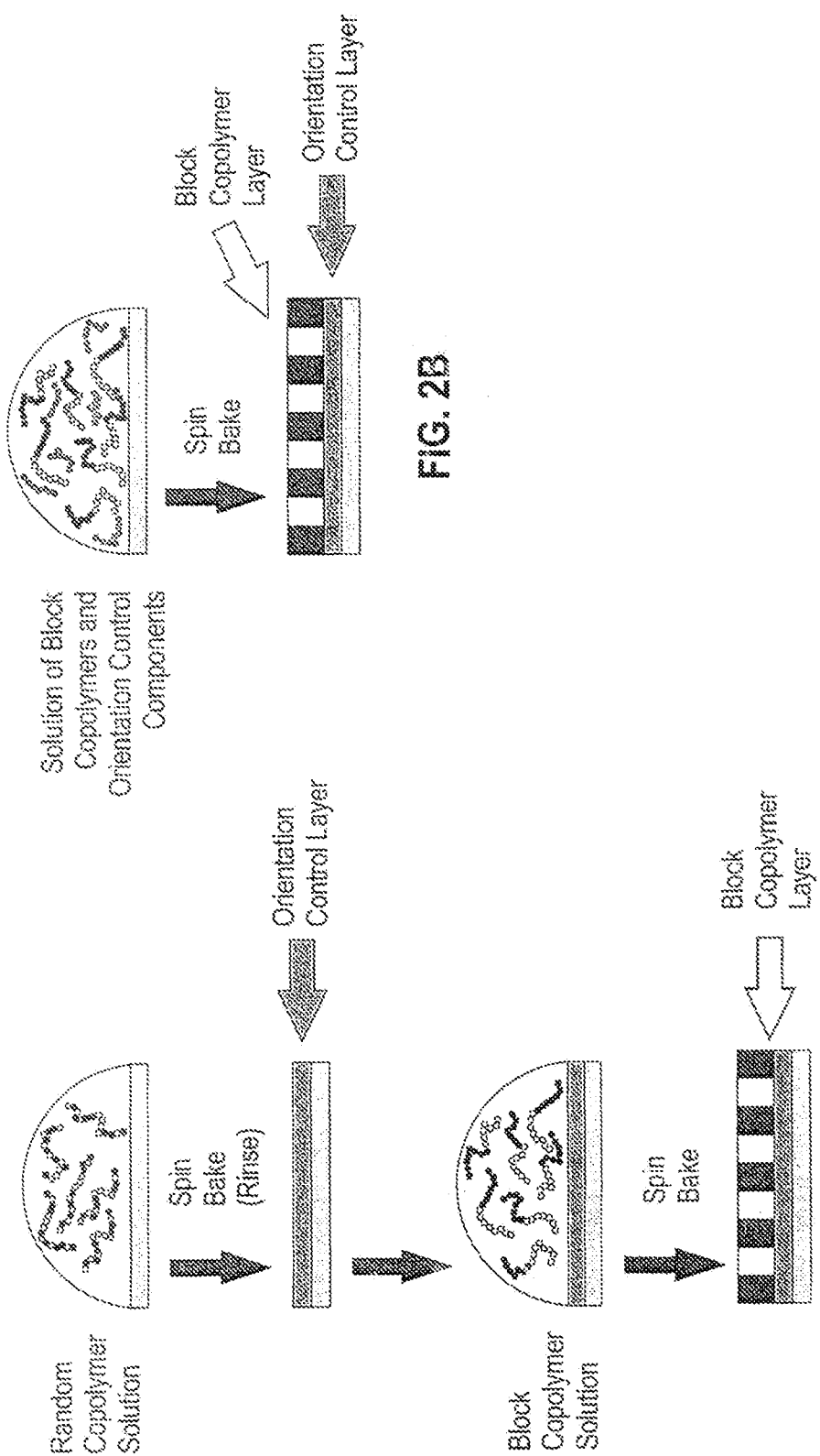

Poly(Dicyclopentadiene Methacrylate Epoxide)

Poly(Styrene-co-Dicyclopentadiene Methacrylate Epoxide)

METHOD OF CONTROLLING ORIENTATION OF DOMAINS IN BLOCK COPOLYMER FILMS

CROSS-REFERENCE TO RELATED APPLICATIONS

This application is a CONTINUATION application of U.S. application Ser. No. 12/060,516, filed Apr. 1, 2008, which is a Continuation Application of U.S. application Ser. No. 12/013,138, (now U.S. Pat. No. 7,763,319, issued Jul. 27, 2010), the disclosure of which is incorporated by reference herein its entirety.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to a method of orienting microphase-separated domains of block copolymers with respect to a substrate, and specifically to a composition and method of using the composition to orient microphase-separated domains of block copolymers with respect to a substrate.

2. Description of Background

Block copolymers films can be used as a part of an assembly system, in which nanoscale features form when blocks of the block copolymers phase separate into microdomains (also referred to herein as "microphase-separated domains" or "domains") to reduce the total free energy. Such thin films of block copolymers provide features having spatial chemical contrast at nanometer-scale, and consequently by their ability to generate these periodic nanoscale structures have been used as a low-cost material for nanopatterning. One problem in block copolymer patterning is with respect to controlling the orientation of the assembled microdomains. For example, lamellae forming block copolymers (FIG. 1A) can align their domains parallel to the plane of the substrate on which they are coated (FIG. 1B), or perpendicularly to the substrate surface (FIG. 1C). When lamellae form parallel to the plane of the substrate, one lamellar phase forms a first layer at the surface of the substrate (in the x-y plane of the substrate), and another lamellar phase forms a second, parallel layer on the first layer, so that no patterns of microdomains are obtained when viewing the film along the perpendicular (z) axis; however, when lamellae form perpendicular to the surface, the perpendicularly oriented lamellae provide nanoscale line patterns. Without external orientation control, thin films of block copolymers tend to organize into randomly oriented nanostructures or undesired morphologies, which are of no use for nanopatterning because of the random nature of the features.

Orientation of block copolymer microdomains can be obtained by pairing the assembly process of the layer of block copolymer, with an external orientation biasing method such as use of a mechanical flow field, electric field, temperature gradient, or by the influence of surface interaction on the block copolymer by a surface modification layer. Of these, use of a surface modification layer for orientation control is relatively straightforward to integrate into a spin-casting or other film-forming manufacturing process, and is therefore desirable. Random copolymer brushes, thermally cross-linked random copolymers, and assembled monolayers have each been used as the basis of an orientation control layer to induce preferential orientation in block copolymer thin films.

An orientation control layer can present a neutral or a non-neutral surface to block copolymers. The orientation control layer can have a surface that is preferentially wetted by a particular block of the block copolymer; such a surface is considered not to be neutral. The surface of neutral orientation control layer is wettable by more than one block in the block copolymer. Therefore, on a neutral orientation control layer, the cylinder-forming and lamellae-forming block copolymer form laterally microphase-separate domains which orient perpendicularly to the neutral orientation control layer. Typical neutral orientation control layers have been prepared by casting a film of a random copolymer comprising the monomers of each block. For example, a neutral orientation control layer for the poly(styrene-b-methyl methacrylate) diblock copolymer can be made from a random copolymer of styrene and methylmethacrylate.

While surface modification methods, particularly use of orientation control layers, can be integrated into the manufacturing process, additional processing steps are necessary, including dispense, spin, bake, or rinsing steps, to apply the orientation control layer prior to casting block copolymer thin films, the sum of which extend process cycle time and increases the complexity of the processing sequence. Longer processes (i.e., those having more processing steps) are not generally desirable, as such processes introduce more opportunity for introduction of coating defects, reducing overall device yield and increasing the cycle time for producing devices.

SUMMARY OF THE INVENTION

The shortcomings of the prior art are overcome and additional advantages are provided through the provision of a simple and compatible method for orientation control for successful implementation of block copolymer patterning of a composition.

In an embodiment, a composition comprises an orientation control component, a block copolymer assembly component comprising a block copolymer that forms microphase-separated domains upon forming a film, and a solvent in which both orientation control component and block copolymer assembly component are soluble, wherein the orientation control component is segregated from the block copolymer assembly component upon forming a film from the composition, and the orientation control component has an affinity for the surface of a substrate that is greater than the block copolymer assembly component's affinity for the surface of the substrate such that the orientation control component is enriched at a surface of the substrate upon forming the film.

In another embodiment, a method comprises applying the composition to a surface of a substrate; and forming a compositionally vertically-segregated film on the surface of the substrate from the composition, wherein the orientation control component is enriched adjacent to the surface of the substrate, the block copolymer assembly component is enriched at an air-film interface, and the different blocks of the block copolymer form laterally-segregated microphase-separated domains.

In another embodiment, a method comprises forming a film of a block copolymer assembly having microphase-separated domains with a desired orientation, from a composition comprising an orientation control component, and a block copolymer assembly component that forms microphase-separated domains upon forming a film, and a solvent in which both the orientation control component and block copolymer assembly component are soluble, wherein the orientation control component is vertically segregated from the block copolymer assembly component upon forming a film from the composition, and the orientation control component has an affinity for the surface of a substrate that is greater than the block copolymer assembly component's affinity for the surface of the substrate, such that the orientation control component is enriched at the surface of the substrate upon forming the film.

In another embodiment, a method of forming a block copolymer assembly comprising oriented microphase-separated block copolymer domains in a compositionally vertically-segregated film comprises: applying a composition to a surface of a substrate, the composition comprising an orientation control component comprising a homopolymer or copolymer of epoxycyclopentadienyl (meth)acrylate, and a block copolymer assembly component comprising a diblock copolymer or triblock copolymer of styrene and methyl methacrylate, wherein the orientation control component is vertically segregated from the block copolymer assembly component upon forming a film from the composition, and the orientation control component has an affinity for the surface of a substrate that is greater than the block copolymer assembly component's affinity for the surface of the substrate; forming a layer of the composition on the surface of the substrate; and baking the composition, wherein the orientation control component and block copolymer assembly component segregate to form a compositionally vertically-segregated film on the surface of the substrate during forming, wherein the orientation control component is enriched at a film-substrate interface, and the block copolymer is enriched at an air-film interface.

A film prepared by the method, and a topographical pattern formed by selectively removing a microphase-separated domain of the block copolymer assembly are also disclosed.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a compositionally segregated film which provides for a simultaneous formation of an orientation control layer at the surface of a substrate, and microphase-separated block copolymer layer opposite the surface of the substrate. The method as disclosed allows for the assembling preparation of nanoscale structural features using a single deposition step, thereby reducing processing and cycle time in the fabrication of such structures, and eliminating the need for the logistical problems of acquiring, storage, and dispensing of multiple components.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

FIG. 2 illustrates schematic representations of: (A) a conventional orientation control method, and (B) a one-step orientation control method for microphase orientation control in block copolymer thin films;

Figure 1D:
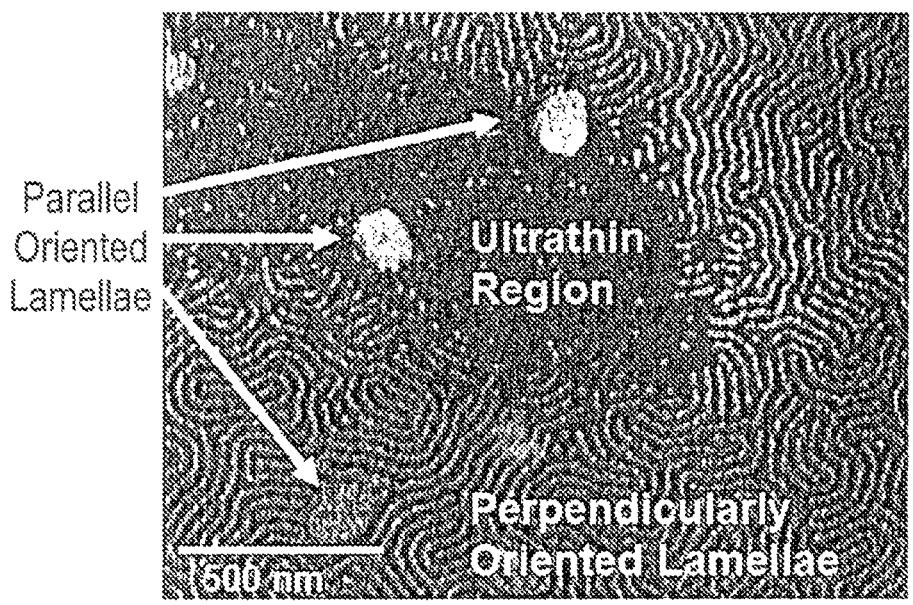
FIG. 1 illustrates schematic representations of: (A) lamellae-forming block copolymers in which different blocks are depicted with different fill patterns; (B) a block copolymer thin film with lamellar domains oriented parallel to the substrate; (C) a block copolymer thin film with lamellae domains oriented perpendicular to the substrates; (D) an atomic force microscopy (AFM) image of an exemplary lamellae-forming poly(styrene-b-methyl methacrylate) (abbreviated "PS-b-PMMA") film formed on a silicon substrate without orientation control.

The detailed description explains the preferred embodiments of the invention, together with advantages and features, by way of example with reference to the drawings.

DETAILED DESCRIPTION OF THE INVENTION

Disclosed herein is a "one-step" method for generating a film (also broadly referred to herein as a compositionally segregated film) comprising an orientation control layer or region and a thin film of block copolymer with controlled orientation of the microdomains, by a single spin-and-bake step. The orientation control layer or region desirably comprises orientation control components that can crosslink during subsequent processing.

Unexpectedly, it has been found that combining the microdomain-forming block copolymer with the orientation control component provides a single film forming composition which, when coated on a substrate in a film-forming process will, when the block copolymer and orientation control component vertically segregate, form an orientation control region or layer of the orientation control component at the coated surface, and a microdomain-forming region or layer of the block copolymer at the surface-air interface opposite the coated surface of the substrate.

As disclosed herein, "immiscible" and "immiscibility" of these polymer components refers to the propensity of the two polymer components (i.e., the block copolymer and the orientation control component) to phase segregate due to an unfavorable free energy of mixing of the polymers. Also as used herein, "segregate" refers to the propensity of the block copolymer and the orientation control component to separate during the film forming process. "Vertical" refers to the direction of orientation orthogonal to the plane of the substrate, and "vertically segregated" is exemplified by the segregation of components (such as the orientation control component and block copolymer) to form stratified layers or a gradient. Similarly, "lateral" refers to the direction of the x-y plane of the substrate and "laterally segregated" is exemplified by the formation of different, microphase-separate domains formed adjacent to one another on the surface of the substrate.

With a neutral orientation control layer, the block copolymer domains form at the interface and extend vertically from the surface of the substrate. Typical exemplary methods of film forming include but are not limited to spin coating, spray coating, doctor blading, dip coating, optionally followed by baking. "Baking", is a general process wherein the temperature of the substrate and coated layers thereon is raised above ambient temperature to effect additional processing of the film such as removal of volatile compounds, reducing the film volume, further orienting or diffusing components in the film, or effecting further chemical reactions within the film. "Annealing" is a process used to remove defects and stresses in the film and can be accomplished by a number of methods including, but not limited to, thermal annealing, solvent vapor annealing, zone annealing, annealing under external electrical, magnetic, or field, or the like. Thermal annealing, sometimes referred to as "thermal curing" can be a baking process for removing defects and improving the ordering of block copolymer domains in the layer of the block copolymer assembly, and generally involves heating at elevated temperature (e.g., above the glass transition temperature of the block copolymer), typically for a period of time (several minutes to several days) at or near the end of the film-forming process. Annealing, where performed, typically is used to improve ordering of the laterally separated microdomains.

By the nature of the segregation mechanism, upon forming a film with the film-forming composition on a substrate in this one-step method, a compositionally segregated film is generated with the orientation control component enriched to form a region or layer at the surface of the substrate being coated, and with the block copolymer enriched at the air interface to form a block copolymer enriched region or layer at the top of the orientation control component-enriched region or layer. The method provides for a preferred, controllable orientation of microdomains in a variety of block copolymer thin films, including arrangement of the microdomains to selectively provide parallel or perpendicularly oriented lamellae or cylinders in diblock copolymers, and more complicated structures including tri-block and multi-block copolymers. The method can be used to prepare oriented block copolymer microdomains on a variety of substrates, provided that the orientation control components segregate to the substrate interfaces and the block copolymer segregates to the surface of the orientation control region, disposed opposite the substrate.

The "microdomain", sometimes referred to as "microphase-separated domain" or simply as "domain", is a structural feature in a block copolymer film wherein blocks of the block copolymer aggregate to form regular periodic structures, with the adjustable dimensions of the structures tuned according to the number of monomeric repeating units of the block forming the domain, the functionality of the monomers in the domain, and the arrangement of monomers in the block including sequence and/or stereochemistry (e.g., atactic, isotactic, or syndiotactic monomer arrangements; or chiral monomers).

Where "layer" is used, a discrete, substantially compositionally distinct phase with a distinct interface adjacent to another substantially compositionally distinct phase is meant. Where "region" is used, a phase that contains more of one component (such as an orientation control component) than another component (such as a block copolymer) is meant. Regions need not have a discrete interface, but may be characterized compositionally, or based on performance properties. A region can thus have a gradient composition which varies from one side of the film to the other. Where the compositional gradient is perpendicular to the plane of the substrate, the gradient can be said to be "vertical" or oriented "vertically". The formation of the vertically segregated film occurs during film-forming, which can comprise in sequence coating the film forming composition to provide the film, baking the film, and where desired, annealing the film. Vertical segregation of the orientation control components and block copolymer assembly components occurs during one or more of these operations. In some embodiments, the vertical phase segregation can occur at either the coating or baking steps; in other embodiments, vertical segregation occurs during both the coating and baking steps. Where the phase segregation occurs during the coating step, the relative immiscibility of the components with each other and/or with a common solvent can selectively deposit the orientation control layer components on the substrate, followed by depositing of the block copolymer assembly components. Alternatively, or in addition, baking can separate these components where sufficient mobility of the components in the matrix occurs, such as for example where solvent is present in the coated film and/or where the components are mobile under the conditions of bake, for example where baking takes place at a temperature higher than the Tg of the orientation control components and/or block copolymer assembly components. Further, additional vertical segregation can occur by annealing, during which the rearrangement of the components also results in removal of coating defects. In a specific embodiment, the film forming comprises coating by a spin-casting method, and baking.

In an embodiment, a vertically segregated two-layer film can be formed. In another embodiment, a vertically segregated multilayer film having more than two discrete layers can be formed. In another embodiment, a vertically segregated gradient film is formed from at least two primary components, in which the gradient film composition as determined vertically from the surface of the substrate can vary from 100% of orientation control component at the film-substrate interface to 100% of block copolymer assembly component at the air-surface interface. In this way, the gradient is vertically oriented.

By the disclosed method, during forming of the compositionally vertically-segregated film, the film-forming composition can segregate as follows: (i) In one embodiment, a two layer film is formed, having an orientation control layer disposed on a surface of the substrate, and a block copolymer assembly layer disposed on a surface of the orientation control layer opposite the substrate, where the orientation control components and block copolymer assembly components are fully segregated. (ii) In another embodiment, a gradient film is formed wherein the orientation control component is enriched adjacent to the surface of the substrate, the block copolymer is enriched in the gradient film at a surface opposite the surface of the substrate, and the region of the film in between the surfaces comprises an admixture of the orientation control component and the block copolymer assembly component(s).

A complete separation of the orientation control component and the block copolymer assembly component need not occur during segregating, so long as the block copolymer assembly can form microdomains to generate useful patterns. In an embodiment, the portion of the film containing the orientation control component can typically have a thickness of about 1 nm to about 1,000 nm, which can vary depending on the particular compositional and processing parameters selected.

In a conventional scheme (FIG. 2A), a block copolymer thin film with preferred microphase separated domain orientation is created by two separate process steps. In FIG. 2A, the orientation control layer is first applied to a substrate surface with coating, baking and optional rinsing processes to provide a neutral surface which does not dissolve in any subsequent film forming process conducted thereon. The film of the block copolymer assembly is subsequently formed from a composition containing a block copolymer and any desired additives applied to the surface of the pre-made orientation control layer opposite the substrate surface, and baked to form block copolymer domains with preferred orientation. In this way, the conventional scheme requires two film forming processes, such as sequential spin-cast then bake processes, to create block copolymer thin films of preferred orientation.

FIG. 2B illustrates an embodiment of the method disclosed herein, in which an exemplary two-layer film stack including the layer comprising the block copolymer assembly and the orientation control layer is form in a single spin-cast then bake step. Vertical segregation of the block copolymer assembly components and orientation control components creates, in the embodiment illustrated, the two-layer film where the block copolymer assembly components segregate to form top layer (i.e., the exposed surface layer) and the orientation control components segregate to the substrate interface to form the bottom layer (i.e., the layer disposed on the surface of the substrate). The orientation control layer directs the phase segregation of block copolymer assembly components to form the preferred orientation of the block copolymer assembly layer. As shown in FIG. 2B, the neutral orientation control layer provides a neutral surface to allow more than one domain of the block copolymer assembly to be present at the surface interface. In addition to providing a neutral interface, the orientation control components are able to dissolve in the same casting solvent as the block copolymers, and segregate from the block copolymers to form a layer or region to induce the preferred orientation in the two-layer, multilayer, or gradient structures.

The method proposed in this invention advantageously reduces by at least half the number of process steps needed to generate a block copolymer thin film with preferred orientation. This method can also considerably shorten the process time. Neutral orientation control underlayers have been demonstrated by Hawker and Russell [P. Mansky, Y. Liu, E. Huang, T. P. Russell, and C. Hawker, "Controlling polymer surface interaction with random copolymer brushes", *Science*, vol. 275, p. 1458, (1997); Du Yeol Ryu, Kyusoon Shin, Eric Drockenmuller, Craig J. Hawker, and Thomas P. Russell, "A generalized approach to modification of a solid surface," *Science*, vol. 308, p. 236, (2005)] and Gopalan [Eungnak Han, Insik In, Sang-Min Park, Young-Hye La, Yao Wang, Paul F. Nealey, and Padma Gopalan, "Photopatternable imaging layers for controlling block copolymer micro domain orientation", *Advanced Materials*, vol. 19, p. 4448 (2007)]. However, forming methods for these prior art orientation control underlayers require time periods ranging from minutes to hours to attach the neutral underlayer components to the substrate to achieve the desired surface neutrality, and the formation of some of these underlayers further requires an additional rinse step to remove unattached neutral underlayer component materials, adding to the time, number of steps, and overall cost of the methods.

Thus, the film-forming composition used to provide the film (i.e., the orientation control layer and block copolymer assembly layer) comprises at least 1) the orientation control component, 2) a block copolymer assembly component comprising a block copolymer which can assemble to form microphase-separated domains in the film, and 3) a solvent in which both orientation control component and block copolymer assembly component are soluble. These components are further described hereinbelow.

In an embodiment, the orientation control component comprises an epoxy-containing polymer that can be crosslinked by application of heat and/or a catalyst. The epoxy-containing polymer is desirably the polymerization product of an epoxy-containing monomer, but can be any epoxy-modified polymer or resin provided the epoxy-modified polymer has sufficient additional properties such that the desired film forming, phase segregated, surface adhesion, and microphase orienting properties of the resulting film are not significantly adversely affected. In an embodiment, the epoxy-containing polymer is prepared from epoxy-containing monomers having a radically polymerizable carbon-carbon double bond. Useful monomers comprise epoxy-containing (meth)acrylate monomers having a $C_{3-30}$ epoxy-containing group, $C_{4-30}$ epoxy-containing olefinic monomers, or a combination comprising at least one of the foregoing epoxy-containing monomers. In a specific embodiment, the epoxy-containing polymer comprises radically polymerized epoxy-containing monomers selected from the group consisting of glycidyl (meth)acrylate, 2,3-epoxycyclohexyl (meth)acrylate, (2,3-epoxycyclohexyl)methyl (meth)acrylate, 5,6-epoxynorbornene (meth)acrylate, epoxydicyclopentadienyl (meth)acrylate, and combinations comprising at least one of the foregoing. A preferred monomer is epoxydicyclopentadienyl (meth)acrylate. Herein, where "(meth)acrylate" is used, either an acrylate or methacrylate is contemplated unless otherwise specified.

The epoxy-containing polymer can also be a copolymer further comprising an additional monomer in addition to the epoxy-containing monomer. In an embodiment, the additional monomer comprises a (meth)acrylate monomer derived from a $C_{1-30}$ alcohol, a $C_{2-30}$ olefinic monomer, or a combination comprising at least one of the foregoing additional monomers. In a specific embodiment, the additional monomer is methyl (meth)acrylate, ethyl (meth)acrylate, butyl (meth)acrylate, hexyl (meth)acrylate, cyclohexyl (meth)acrylate, benzyl (meth)acrylate, ethylcyclopentyl (meth)acrylate, methylcyclopentyl (meth)acrylate, dicyclopentyl (meth)acrylate, 2-hydroxy ethyl (meth)acrylate, 2-hydroxy propyl (meth)acrylate, hydroxy adamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth)acrylate, isobornyl (meth)acrylate, benzyl (meth)acrylate, styrene, 4-methyl styrene, α-methyl styrene, 4-hydroxy styrene, 4-acetoxy styrene, ethylene, propylene, 1-butene, 1,3-butadiene, vinyl acetate, dihydropyran, norbornene, maleic anhydride, or a combination comprising at least one of the foregoing additional monomers.

In an exemplary embodiment, a useful epoxy-containing polymer is poly(epoxydicyclopentadienyl methacrylate). In another exemplary embodiment, an epoxy containing copolymer useful herein is poly(styrene-ran-epoxydicyclopentadienyl methacrylate), a random copolymer of styrene and expoxydicyclopentadienyl methacrylate.

The epoxy-containing polymer desirably has a molecular weight and polydispersity amenable to processing as disclosed herein, including casting, and such that the phase segregation is not significantly adversely affected. In an embodiment, the epoxy containing polymer has a number averaged molecular weight (Mn) of 1,000 to 198,000. In an embodiment, the epoxy-containing polymer can have a polydispersity (Mw/Mn) of 1.01 to 4. Molecular weight, both Mw and Mn, can be determined by any suitable method used in the art, and is generally determined by gel permeation chromatography using a universal calibration method, calibrated to polystyrene standards.

The film-forming composition for use in the method comprises a block copolymer as a block copolymer assembly component. The block copolymer comprises blocks comprising one or more monomers, such that at least two blocks in the block copolymer are compositionally, structurally, or both compositionally and structurally non-identical. The blocks themselves can be homopolymers, or random or alternating copolymers. Different kinds of block copolymers can be used in the composition, including an amphiphilic organic block copolymer, amphiphilic inorganic block copolymer, organic diblock copolymer, organic multiblock copolymer, inorganic-containing diblock copolymer, inorganic-containing multiblock copolymer, linear block copolymer, star block copolymer, dendritic block copolymer, hyperbranched block copolymer, graft block copolymer, or a combination comprising at least one of the foregoing block copolymers. Suitable inorganic constituents of the inorganic-containing polymers, monomers, molecules, and additives include, for example, those based on silicon, germanium, iron, titanium, aluminum, or the like. Exemplary silicon- and germanium-containing monomers and polymers can include those disclosed by H. Ito in "Chemical Amplification Resists for Microlithography" *Adv. Polym. Sci.*, vol. 172, pp. 37-245 (2005); exemplary metal containing monomers and polymers include those disclosed by Ian Manners in "Synthetic metal-containing polymers", Wiley-VCH, 2004; exemplary silicon-containing molecules and additives such as organosilicates include those disclosed by E. M. Freer, L. E. Krupp, W. D. Hinsberg, P. M. Rice, J. L. Hedrick, J. N. Cha, R. D. Miller, and H. C. Kim in "Oriented mesoporous organosilicate thin films", *Nano Letters*, vol. 5, 2014 (2005); and exemplary metal-containing molecules and additives include those disclosed by Jinan Chai, Dong Wang, Xiangning Fan, and Jillian M. Buriak, "Assembly of aligned linear metallic patterns on silicon", *Nature Nanotechnology*, vol. 2, p. 500, (2007).

The blocks of the block copolymer can be any appropriate microdomain-forming block that can be copolymerized with another, dissimilar block. Blocks can be derived from different polymerizable monomers, where the blocks can include but are not limited to: polyolefins including polydienes, poly(alkylene oxides) (sometimes referred to as polyethers); poly((meth)acrylates), polystyrenes, polyesters, polyorganosiloxanes, polyorganogermanes, and the like. It will be understood that these blocks are exemplary and should not be considered as limiting.

In an embodiment, the blocks in the block copolymer comprise monomers selected from $C_{2-30}$ olefinic monomers, $C_{1-30}$ (meth)acrylate monomers, silicon monomers, germanium monomers, or a combination comprising at least one of the foregoing monomers. In a specific embodiment, exemplary $C_{2-30}$ olefinic monomers for use in the blocks include, ethylene, propylene, 1-butene, 1,3-butadiene, vinyl acetate, dihydropyran, norbornene, maleic anhydride, styrene, 4-hydroxy styrene, 4-acetoxy styrene, 4-methylstyrene, or α-methylstyrene; and the (meth)acrylate monomers derived from $C_{1-30}$ alcohols can include methyl (meth)acrylate, ethyl (meth)acrylate, n-propyl (meth)acrylate, isopropyl (meth)acrylate, n-butyl (meth)acrylate, isobutyl (meth)acrylate, n-pentyl (meth)acrylate, isopentyl (meth)acrylate, neopentyl (meth) acrylate, n-hexyl (meth)acrylate, cyclohexyl (meth)acrylate, isobornyl (meth)acrylate, or hydroxyethyl (meth)acrylate. Exemplary blocks which are homopolymers can include blocks prepared using styrene, i.e., polystyrene, or (meth) acrylate homopolymeric blocks such as poly(methylmethacrylate); exemplary random blocks include, for example, blocks of styrene and methyl methacrylate, e.g., poly(styrene-ran-methyl methacrylate), randomly copolymerized; and alternating copolymer blocks can include blocks of styrene and maleic anhydride which is known to form a styrene-maleic anhydride dimer repeating structure due to the inability of maleic anhydride to homopolymerize under most conditions, e.g., poly(styrene-alt-maleic anhydride). It will be understood that such blocks are exemplary and should not be considered to be limited thereto.

Exemplary block copolymer assembly components that are contemplated for use in the present method also include a combination comprising at least one block copolymer. The block copolymer can be di-block copolymer as well as multi-block copolymer. Exemplary di-block copolymers include poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly((styrene-alt-maleic anhydride)-b-styrene), poly(styrene-b-dimethylsiloxane), and poly(styrene-b-dimethylgermanium oxide). Exemplary tri-block copolymers include poly(styrene-b-methyl methacrylate-b-styrene), poly(methyl methacrylate-b-styrene-b-methyl methacrylate), poly((styrene-alt-maleic anhydride)-b-styrene-b-methyl methacrylate), poly(styrene-b-dimethylsiloxane-b-styrene), and poly (ethylene oxide-b-isoprene-b-styrene). An exemplary multi-block copolymer is poly(styrene-b-methyl methacrylate)$_n$, where n is greater than 1. It will be understood that the foregoing exemplary block copolymers are only intended to be illustrative and should not be considered as limited thereto.

The block copolymer can desirably have an overall molecular weight and polydispersity amenable to the film forming steps disclosed herein, such that formation of domains in the block copolymer assembly can proceed without adversely affecting the segregation of the epoxy-containing polymer from the block copolymer, and vice versa. In an embodiment, the block copolymer has a number averaged molecular weight (Mn) of 1,000 to 200,000 g/mol. Molecular weight, both Mw and Mn, can be determined by, for example, gel permeation chromatography using a universal calibration method, calibrated to polystyrene standards.

The solvent in the film-forming composition can be a single solvent or multiple solvent system in which each component is selected to provide optimal solvent properties for both solubilizing the components in the film-forming composition, and to provide optimal film forming properties for the composition. Exemplary solvents include propylene glycol methyl ether acetate (PGMEA), ethyl lactate (EL), ethoxyethyl propionate (EEP), 2-heptanone, cyclohexanone, gamma-butyrolactone (GBL), or a combination comprising at least one of the foregoing solvents.

It has been found, in an embodiment, that a combination of solvents having different solvating properties, and different evaporation rates, can be effectively used to provide optimum control of the film-forming process, including both the segregation of the orientation control components from the block copolymer assembly components, and the concurrent formation of microphase-separated domains due to control of the different rates of desolvation, deposition and assembly of these components on the surface of the substrate. Specifically, for selective deposition, the orientation control component(s) is advantageously slightly less soluble in the solvent than is the block copolymer assembly component(s). This solubility difference and selectivity can be fine tuned by use of a binary, ternary, or multi-component solvent. In an exemplary embodiment, a combination of solvents that is useful for film forming control is PGMEA and GBL. In a specific embodiment, the weight percentage ratio of PGMEA to GBL can be from 99.9:0.1 to 50:50, based on the combined weight of the solvents. In a specific exemplary embodiment, a 90:10 ratio (w/w) of PGMEA and GBL is useful as a solvent.

The film forming composition can further comprise additional components to assist in forming either or both of the orientation control layer and the block copolymer assembly, including: additional polymers, including homopolymers, random copolymers, crosslinkable polymers; additives including surfactants, photoacid generators, thermal acid generators, quenchers, hardeners, cross-linkers, or chain extenders; or a combination comprising at least one of the foregoing; where one or more of the additional components can, in the film forming step, co-assemble into microphase-separated domains together with block copolymer to form the block copolymer assembly.

Exemplary photoacid generators and thermal acid generators include N-hydroxyphthalimide triflate, bis(4-t-butyl phenyl)iodonium triflate, bis(4-t-butyl phenyl)iodonium perfluoro-1-butanesulfonate, bis(4-t-butyl phenyl)iodonium perfluoro-1-octanesulfonate, bis(phenyl)iodonium hexafluoroantimonate, N-hydroxy-5-norbornene-2,3-dicarboximide perfluoro-1-butanesulfonate, or a combination comprising at least one of the foregoing acid generators.

It is contemplated that by the addition of additional components to the film-forming composition as disclosed above, different desirable properties can be obtained in the microphase-oriented domains of the block copolymer assembly layer. For example, the additional polymers or additives can co-assemble in the microphase-separated domains to form a composite microphase-separated domain, in which the properties of the microphase-separated domains can be adjusted based on the relative properties of the additives. For example, additives such as polymers that can adopt different conformations can be added, which can be removed from block copolymer assembly by thermal processes, by selective etch processes, or by selective solubility using organic, aqueous, or aqueous acidic or basic media, alone or in conjunction with photolytic contrast enhancement methods, subsequent to film forming. Such regions could be made porous, with oriented pores. In other embodiments, the additives incorporated into the microphase-separated domains can be sufficiently compositionally dissimilar (e.g., can comprise metal or metalloid atoms such as iron, titanium, silicon and/or germanium) so as to enhance etch resistance, or conversely to enhance etch selectivity (e.g., where the component has higher oxygen content than the domain and possesses a relatively high Ohnishi parameter) in a microphase-separated domain relative to adjacent microphase separated domains, or within the microphase separated domains. Any and all such further applications and interactions are contemplated within the disclosure presented herein.

The film-forming composition can, in an embodiment, include the block copolymer and the orientation control component in a weight ratio of 1:0.01 to 0.01:1 (w/w) of block copolymer to orientation control component. The total solids content of the composition comprising the orientation control component, block copolymer, and any additives, is 0.01 to 30 wt % based on the total weight of the composition.

A more detailed description of the method is described hereinbelow. In the method of orienting microphase-separated domains disclosed herein, forming the film having the oriented microphase-separated block copolymer assembly includes applying the composition to a surface of a substrate, and forming a compositionally segregated film on the surface of the substrate from the composition. The orientation control component and block copolymer, as discussed hereinabove, form the compositionally segregated film on the surface of the substrate during the film forming process, wherein the orientation control component is enriched the surface adjacent to the substrate, and the block copolymer assembly is enriched at the air-film interface. Such a segregated film can be applied using any number of methods including spin-casting, dip-coating, doctor blading, spray dispense, or the like. In an embodiment, the composition is applied by a spin casting method, which comprises dispensing the composition onto a surface of a substrate, such as for example a silicon wafer, and spinning the substrate to distribute the composition over the surface of the substrate. The solvent generally evaporates during spinning, leaving the film. Additional processing of the film can include baking the composition disposed on the substrate, using an oven or hot plate.

In an embodiment, a method of forming oriented microphase-separated block copolymer domains in a compositionally segregated film thus comprises applying a composition comprising an orientation control component including a homopolymer or copolymer of epoxycyclopentadienyl (meth)acrylate, and a block copolymer assembly component comprising a block copolymer having at least one block capable of forming lamellae or cylindrical block structures, to a surface of a substrate. The orientation control component is segregated from the block copolymer upon forming a film from the composition, and the orientation control component has an affinity for the surface of a substrate greater than that of the block copolymer. The composition is applied by coating it over the surface of the substrate, and then it is baked. During film forming, the orientation control component and block copolymer segregate to form a compositional gradient perpendicular to the plane of the substrate, and thereby form the segregated film on the surface of the substrate. Vertical segregation can occur during coating, baking, annealing where desired, or a combination of these. The orientation control component is enriched at the surface of the segregated film adjacent to the surface of the substrate, and the block copolymer is enriched at a surface of the compositionally segregated film opposite the surface of the substrate.

The film forming can be accomplished by, in one embodiment, spin-casting. In an embodiment, where spin casting is used, spinning is carried out at 500 to 10,000 rpm. The solvent is largely removed from the film by the spinning process, during which the film can segregate to substantially form the orientation control layer and the microphase-separated domains in the block copolymer assembly. In a further embodiment, baking is carried out at 80 to 300° C. for a time of 30 seconds to 20 hours. Baking can be performed not only to remove residual solvent from the segregated film, but can in an alternative or further embodiment, also induce microphase segregation and domain formation in the block copolymer assembly, or can induce vertical segregation of the block copolymer assembly and orientation control components.

In an embodiment, the block copolymer film as prepared by the method includes microdomains which are cylindrical and oriented perpendicular to the plane of the substrate, or which are lamellar and oriented perpendicularly to plane of the substrate.

A one-step process can be carried out by forming a segregated film from a mixed solution of block copolymers, substrate-selective orientation components, air-surface-active orientation components and optional additives. In this case, both interface properties of top and bottom interfaces of block copolymer film can be controlled and allowed to generate a block copolymer film with preferred orientation. Multi-layer or multi-gradient film stacks containing oriented block copolymer regions can be generated by vertical segregation using this method. In an embodiment, the composition further comprises an air-surface-active orientation-control component. Inclusion of such a surface-air interface active component provides an additional orientation control at the air interface surface of the block copolymer enriched region.

By the nature of the phase segregation mechanism, this one-step method is useful to generate preferred orientation of microdomains in a variety of block copolymer films on a variety of substrates, providing the orientation control components preferentially segregate to the substrate interface. For example, poly(styrene-ran-epoxydicyclopentadienyl (meth) acrylate) works as an orientation control component on a variety of substrates including silicon, silicon dioxide, silicon nitride, and the like. Other substrates such as those comprising metal surfaces such as for example gold, aluminum, titanium, tungsten, and the like, or other surfaces including glasses, ceramics, composite surfaces, and the like, could be made that work by tailoring the composition of the orientation control component(s) to be compatible with and provide orientation control properties when disposed on these other surfaces. For example, a composition comprising orientation control components with thiol groups and block copolymer assembly components can be coated on a gold substrate in which the orientation control components (having thiol groups) segregate preferentially to the gold substrate, and the block copolymer assembly components segregate to the air-surface in a one-step, spin-then-bake method.

A topographical pattern is then formed in the overlying block copolymer assembly. For a film comprising the block copolymer assembly, a microphase-separated domain can be selectively removed by a suitable process such as wet or dry etch, development, or solvent solubility, so that one microphase-separated domain comprising one kind of block is selectively removed over another microphase-separated domain comprising another kind of block. Thus, in an embodiment, a microphase-separated domain of the block copolymer (of the block copolymer assembly) is selectively removed to provide a topographical pattern. The topographical pattern can then be transferred to the substrate by a suitable subsequent etch process. In an embodiment, the topographical pattern is generated by selectively etching a microphase-separated domain having a higher Ohnishi number than the other microphase separated domain(s) by an oxygen plasma etch.

The method disclosed herein can be adapted to form a film stack for multilayer patterning schemes such as bilayer or trilayer patterning schemes. Bilayer patterning typically refers to patterning a film stack of a resist and a pattern transfer layer on the substrate. The film stack for a bilayer patterning scheme can be prepared in two different ways. In a first method of making a bilayer film stack, a film of oriented domains of a block copolymer assembly comprising an etch-resistant component can be formed on a previously formed pattern transfer layer, where the orientation control components are disposed between the block copolymer assembly and the pattern transfer layer. The etch-resistant block copolymer assembly can comprise either a block copolymer comprising a block of an etch-resistant material, such as for example a polyorganosiloxane block, a polyorganogermanium block, or the like; or can comprise a block copolymer and inorganic-containing compounds or polymers which can co-assemble with the block copolymer to enrich selective microphase separated domains. After patterning, the microphase-separated domain of the etch resistant block copolymer assembly is sufficiently resistant to etch processes used for pattern transfer by selectively etching the carbon-based underlayer(s) (i.e., the orientation control components from the segregated method disclosed hereinabove, and the previously formed pattern transfer layer). In this scheme, the thickness of the orientation control component region between the etch-resistant block copolymer assembly and the pattern transfer layer can be relatively small compared to the thickness of the etch resistant block copolymer assembly, so that pattern transfer into the underlying pattern transfer layer is facilitated.

In a second method of forming a bilayer film stack, the entire bilayer film stack can be formed in one step directly on a substrate using the method disclosed herein by using an etch resistant block copolymer assembly with etch resistant component(s) as disclosed above (i.e., a block copolymer comprising a block of an etch-resistant material, such as a polyorganosiloxane or polyorganogermanium block, or the like; or where the block copolymer assembly comprises a block copolymer and inorganic-containing compounds or polymers which can selectively co-assemble with the block copolymer to form a microphase-separated domain that contains the inorganic-containing components). In this instance, after patterning to form a topographical pattern by removing the microphase-separated domains without silicon and/or germanium, the silicon and/or germanium containing microphase-separated domain is sufficiently resistant to an etch process that would provide an etch rate for the carbon-based underlayer, (i.e., the orientation control layer comprising the orientation control components) that is greater than that of the etch resistant microphase-separated domains. In this scheme, a larger proportion of the orientation control component relative to the block copolymer assembly component is incorporated into the composition such that it can also serve as the pattern transfer layer.

Bilayer patterning systems typically have thin (less than 100 nm) etch resistant patterning layers (as derived from the block copolymer assembly), and typically have pattern transfer layers that can be 20 nm thick to about 2 μm thick, depending upon the requirements of the application. Where the first method of forming the etch resistant block copolymer assembly and orientation control layer on the pre-formed pattern transfer layer is used, the orientation control components are present in amounts such that the orientation control layer is thin (less than 100 nm). Where the second method of forming the etch resistant block copolymer assembly having the orientation control layer doubling as the pattern transfer layer is used, the orientation control layer is relatively thick (often greater than 100 nm).

The method disclosed herein can also be adapted to forming a pattern for trilayer imaging. In a trilayer imaging method, the trilayer film stack can be formed in successive steps directly on a substrate using the method disclosed herein by first applying a pattern transfer layer to a surface of the substrate, followed by formation of a hardmask (e.g., a spin-on polyorganosiloxane glass, low-temperature oxide, or the like). The orientation control component layer and block copolymer assembly are formed on the surface of the hardmask, where the block copolymer assembly comprises a block copolymer having a block for patterning with an etch rate that is at least comparable to, or desirably less than, the etch rate of the orientation control layer. In this way, when selectively etching through a microphase-separated domain of the block copolymer assembly and the underlying orientation control layer using a pattern open etch to expose the hardmask, the integrity of the pattern can be optimally preserved. The resulting opened pattern has an etch rate lower than that of the hardmask, using for example a halogen etch for pattern transfer into the hardmask. The block copolymer assembly can further comprise additives or polymers which can selectively co-assemble with the block copolymer to form a microphase-separated domain and which can enhance the desired etch rate of the microphase-separated domain relative to the orientation control components and/or hardmask. Pattern transfer from the patterned microphase-separated domains of the block copolymer assembly to the substrate can be accomplished by use of sequential etch processes, comprising: opening the topographical pattern in the block copolymer assembly using an oxygen plasma etch; further transferring the pattern to the orientation control layer by an separate underlayer open etch if necessary; transferring the pattern from the patterned block copolymer assembly/orientation control layer to the hardmask by a halogen etch process; transferring the pattern from the patterned hardmask to the pattern transfer layer by an oxygen plasma etch process; and transferring the pattern from the pattern transfer layer to the substrate by a suitable substrate etch process.

In this embodiment, the orientation control layer or region is desirably as thin as possible, to ensure that the pattern transfers from the patterned block copolymer assembly layer to the orientation control layer, and then to the hardmask without loss of pattern integrity and profile. In an embodiment, the orientation control layer is desirably less than or equal to about 100 nm in thickness, though the thickness can vary depending on the required etch selectivity between the block copolymer assembly, and the orientation control components.

In another embodiment of a trilayer imaging scheme, the orientation control layer can function as the hardmask, thereby obviating the need to deposit a separate hardmask. In this embodiment, the orientation control components comprise inorganic materials such as silicon or germanium, and are deposited using the method described herein on a surface of a pattern transfer layer disposed on a substrate, so that a vertically segregated, etch resistant orientation control layer that also functions as a hardmask is formed during film forming as described above. The orientation control components can comprise a copolymer having inorganic etch-resistant blocks or grafts, such as for example polyorganosilane and/or polyorganogermanium blocks, or alternatively, they can include polymeric or monomeric additives containing inorganic materials such as polyorganosiloxane polymers that segregate from the block copolymer assembly components during film forming to form an orientation control layer along with the other orientation control components. The orientation control layer so formed is etchable under halogen etch (hardmask etch) conditions, but resistant to the oxygen plasma pattern open etch conditions for patterning the block copolymer assembly layer, and is resistant to pattern transfer etch conditions for transferring the hardmask pattern to the pattern transfer layer underlying the hardmask. The trilayer stack comprising the block copolymer assembly layer and etch resistant orientation control layer which serves this dual role as hardmask, are formed simultaneously and in one step on the surface of a pattern transfer layer that has been pre-deposited on a substrate, thereby reducing the number of steps required to form the trilayer imaging system. Pattern transfer from the patterned microphase-separated domains of the block copolymer assembly layer is accomplished by use of sequential etch processes, comprising: opening the pattern in the block copolymer assembly layer by an oxygen plasma etch process; transferring the pattern to the etch resistant orientation control/hardmask layer by a halogen etch process; transferring the pattern from the patterned hardmask to the pattern transfer layer by an oxygen etch process; and transferring the pattern from the pattern transfer layer to the substrate by a suitable substrate etch process.

Articles can be prepared using the method described hereinabove. As one example, one or more aspects of the present invention can be included in an article of manufacture, e.g., one or more computer hardware products such as permanent or rewriteable data storage media such as hard disks readable by a machine, employing, for instance, computer usable media. The media have embodied therein, for instance, computer readable program code means for providing and facilitating the capabilities of the present invention. The article of manufacture can be included as a part of a computer system or sold separately. Also contemplated are applications in semiconductor chips, particularly for preparing features having regular intervals in such devices, including memory devices such as ROM, RAM, PROM, flash, and other memory types; microprocessors including those with memory cache, ASICs, and the like.

The flow diagrams of the figures depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

The invention is further described with respect to the examples, below.

Example 1A

Figure 3:
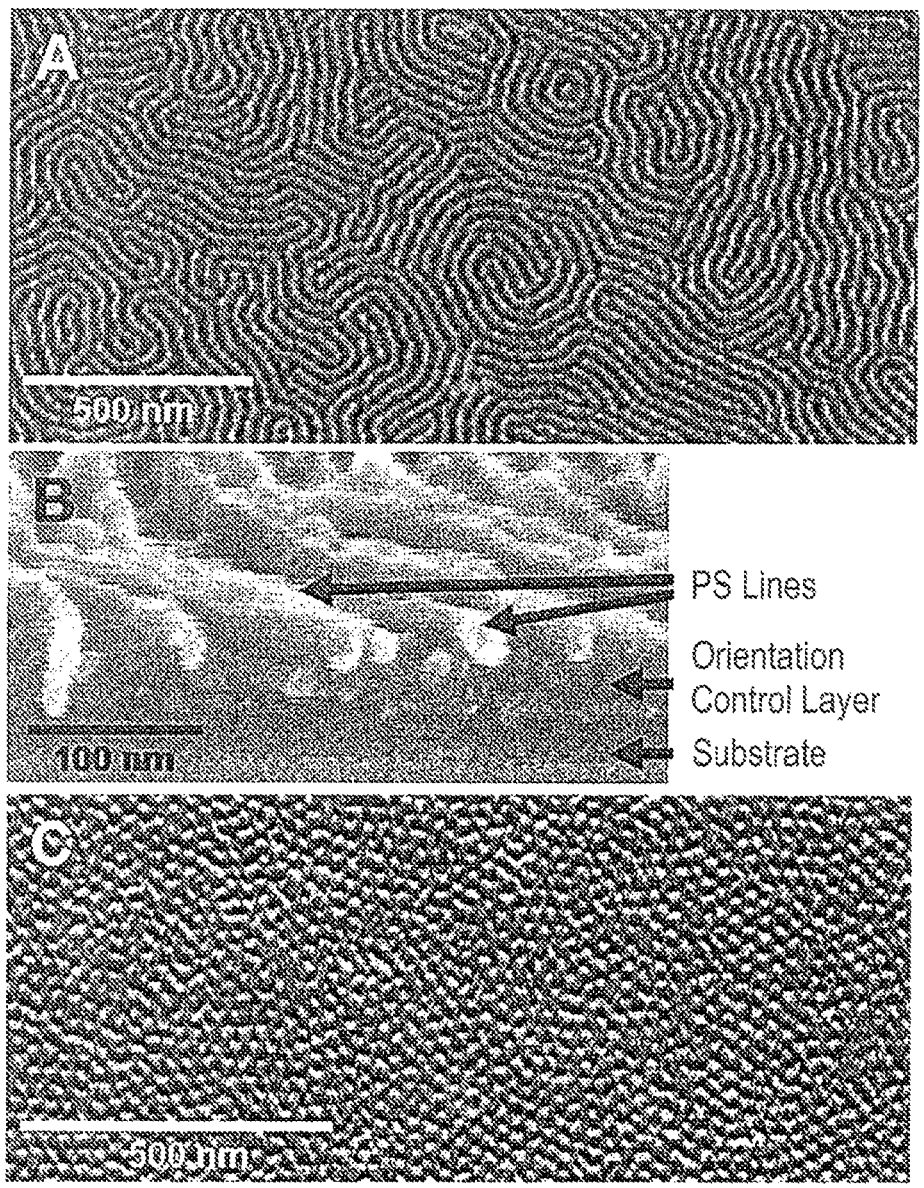
FIG. 3 illustrates (A) an AFM image of an exemplary perpendicularly oriented lamellar PS-b-PMMA film made with a "one-step" orientation control process using poly(epoxydicyclopentadienyl methacrylate) as an orientation control component; (B) a scanning electron micrograph (SEM) image of a cross-section of perpendicular PS lamellae (after removal of PMMA by a selective etch) on the top of orientation control layer of the exemplary film described in (A); (C) an AFM image of perpendicularly oriented cylinders in a PS-b-PMMA film made from a single spin and bake step of a composition of PS-b-PMMA and poly(epoxydicyclopentadienyl methacrylate) as the orientation control component.
Figure 5A:
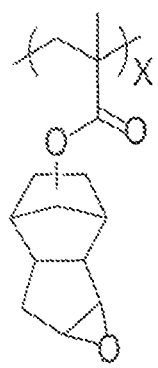
FIG. 5 illustrates the structures of (A) poly(epoxydicyclopentadienyl methacrylate) and (B) poly(styrene-ran-epoxydicyclopentadienyl methacrylate).

A mixed solution of lamellae-forming PS-b-PMMA and the orientation control components poly(epoxydicyclopentadienyl methacrylate) and N-hydroxyphthalimide triflate (PIT) (FIG. 5A) in a weight ratio of 2:1:0.1 (respectively) in a mixed solvent of PGMEA and GBL (9:1 w/w) with total solids of 3% was cast on a silicon substrate and then baked at 200° C. for 1 min. AFM image (FIG. 3A) of the resulting film shows perpendicularly oriented lamellae. Compared to the PS-b-PMMA film on silicon substrate without orientation control components where the orientation of block copolymer domains and film thickness are not well-controlled (FIG. 1D), the PS-b-PMMA film cast from the mixed solution of block copolymer and orientation control component provides perpendicularly oriented lamellae having a uniform thickness over entire area of the substrate. A cross-sectional SEM image (FIG. 3B) of the PS-b-PMMA film cast from the mixed solution of block copolymer and orientation control component clearly shows a two-layer film with a sharp boundary between the layers, and uniformity of thickness. The bottom layer (i.e., "orientation control layer" in FIG. 3B) is a film of the orientation control component, the top layer (i.e., "PS lines" in FIG. 3B) provides PS line patterns from perpendicularly oriented PS-b-PMMA film where PMMA has been selectively removed from the block copolymer layer using acetic acid. It is clear that both PS and PMMA domains are present at the interface between the block copolymer layer and orientation control layer.

Example 1B

Perpendicularly oriented cylindrical PS-b-PMMA is made using the same method and conditions as the perpendicularly oriented lamellae of Example 1A. A solution of cylinder-forming PS-b-PMMA, the orientation control component (poly(epoxydicyclopentadienyl methacrylate)) of Example 1A, and PIT, present in a weight ratio of 2:1:0.1 respectively in a mixed solvent of PGMEA and GBL (9:1 w/w) with a total solids of 3%, was spin-cast and baked under the same conditions as lamella-forming PS-b-PMMA. An AFM image (FIG. 3C) shows perpendicular PMMA cylinders in a PS matrix on the top of orientation control layer (not shown in FIG. 3C). The method demonstrates orientation control of the block copolymer by, as shown, uniform and regular distribution of the cylinder features across the surface.

Example 2

Figure 4:
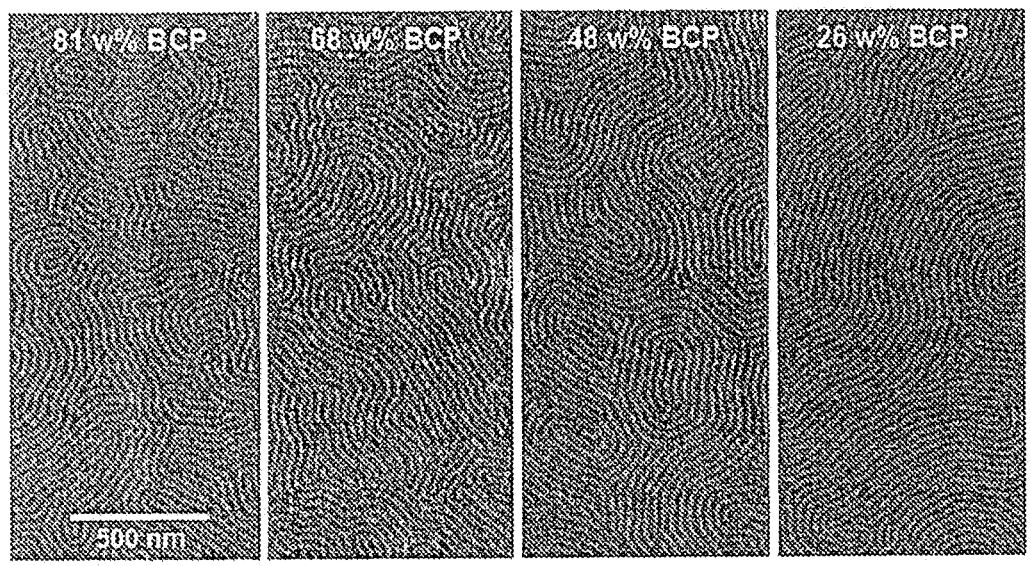
FIG. 4 illustrates four AFM images corresponding to exemplary perpendicularly oriented PS-b-PMMA lamellae made by a single spin-and-bake step, for four exemplary solutions having different weight ratios of PS-b-PMMA (abbreviated as "BCP" for "block copolymer" in the figure) and poly(styrene-ran-epoxydicyclopentadienyl methacrylate)
Figure 5B:
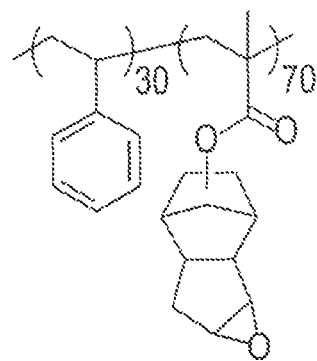

Solutions of lamella forming PS-b-PMMA, an orientation control component, poly(styrene-ran-epoxydicyclopentadienyl methacrylate) (FIG. 5B) and PIT in a mixed solvent of PGMEA and GBL (9:1 w/w) with total solids of 3% were spin-cast on silicon substrates and baked at 200° C. for 6 hrs. Perpendicularly orientated of PS-b-PMMA lamellae were observed to form over a wide compositional range of block copolymer and orientation control components (FIG. 4). In particular, the compositions 81 wt % PS-b-PMMA (abbreviated as "BCP" in FIG. 4), 68 wt % PS-b-PMMA, 48 wt % PS-b-PMMA, and 26 wt % PS-b-PMMA (based on the combined weights of the PS-b-PMMA and the orientation control component (poly(epoxydicyclopentadienyl methacrylate)), each exhibited lamellae formation. The utility of the wide compositional range allows the adjustment of relative thickness of block copolymer and orientation control layer. These results also show the stability of the segregated film after extended baking (6 hours).

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A composition comprising:
    a block copolymer assembly component comprising a diblock copolymer or triblock copolymer of styrene and methyl methacrylate;
    an orientation control component comprising radically polymerized epoxy-containing monomers selected from the group consisting of 2,3-epoxycyclohexyl (meth) acrylate, (2,3-epoxycyclohexyl)methyl (meth)acrylate, 5,6-epoxynorbornene (meth)acrylate, epoxydicyclopentadienyl (meth)acrylate, and a combination comprising at least one of the foregoing; and
    a solvent in which both the orientation control component and block copolymer assembly component are soluble;
    wherein the orientation control component is configured to segregate from the block copolymer assembly component upon forming a film from the composition and become enriched at a surface of the substrate and induce the block copolymer domains to orient perpendicular to a plane of the substrate to form an oriented domain pattern,
    wherein the orientation control component is segregated from the block copolymer assembly component upon forming a film from the composition, and the orientation control component has an affinity for a surface of a substrate that is greater than the block copolymer assembly component's affinity for the surface of the substrate, such that the orientation control component is enriched at the surface of the substrate upon forming the film.

2. The composition of claim 1, wherein the block copolymer assembly component is a PS-b-PMMA block copolymer.

3. The composition of claim 1, wherein the orientation control component further comprises an additional repeat unit.

4. The composition of claim 3, wherein the additional repeat unit is derived from a (meth)acrylate monomer having a $C_{1-30}$ alkyl group, a $C_{2-30}$ olefinic monomer, or a combination comprising at least one of the foregoing repeat units.

5. The composition of claim 3, wherein the additional repeat unit is derived from methyl (meth) acrylate, ethyl (meth)acrylate, butyl (meth)acrylate, hexyl (meth)acrylate, cyclohexyl (meth)acrylate, benzyl (meth)acrylate, ethylcyclopentyl (meth)acrylate, methylcyclopentyl (meth)acrylate, dicyclopentyl (meth)acrylate, 2-hydroxy ethyl (meth)acrylate, 2-hydroxy propyl (meth)acrylate, hydroxy adamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth)acrylate, isobornyl (meth)acrylate, benzyl (meth)acrylate, styrene, 4-methyl styrene, □-methyl styrene, 4-hydroxy styrene, 4-acetoxy styrene, ethylene, propylene, 1-butene, 1,3-butadiene, vinyl acetate, dihydropyran, norbornene, maleic anhydride, or a combination comprising at least one of the foregoing additional monomers.

6. The composition of claim 3, wherein the epoxy-containing polymer is poly(styrene-ran-epoxydicyclopentadienyl methacrylate) or poly(styrene-ran-methyl methacrylate-ran-epoxydicyclopentadienyl methacrylate).

7. The composition of claim 1, wherein the composition comprises at least one additional component selected from the group consisting of:
    additional polymers comprising homopolymers, random copolymers, crosslinkable polymers, inorganic-containing polymers, or a combination comprising at least one of the foregoing; and
    additives comprising inorganic-containing molecules, surfactants, photoacid generators, thermal acid generators, quenchers, hardeners, cross-linkers, chain extenders; or a combination comprising at least one of the foregoing;
    wherein one or more of the additional components co-assemble with the block copolymer to form the block copolymer assembly component.

8. A method of forming a block copolymer assembly comprising oriented microphase-separated block copolymer domains in a compositionally vertically-segregated film comprising:
    applying a composition to a substrate to form a single film, the composition comprising an orientation control component comprising radically polymerized epoxy-containing monomers selected from the group consisting of 2,3-epoxycyclohexyl (meth)acrylate, (2,3-epoxycyclohexyl)methyl (meth)acrylate, 5,6-epoxynorbornene (meth)acrylate, epoxydicyclopentadienyl (meth)acrylate, and a combination comprising at least one of the foregoing, a block copolymer assembly component comprising a diblock copolymer or triblock copolymer of styrene and methyl methacrylate; and a solvent in which both the orientation control component and block copolymer assembly component are soluble;

annealing the single film;

wherein the orientation control component vertically segregates from the block copolymer assembly component such that the orientation control component is enriched at an interface of the single film and the substrate and the block copolymer assembly component is located at an interface of the single film and air; and wherein the segregated orientation control component induces the block copolymer domains to orient perpendicular to a plane of the substrate to form an oriented domain pattern.

9. The method of claim 8, further comprising selectively removing a microphase-separated domain of the block copolymer assembly component to form a topographical pattern.

10. The method of claim 8, wherein the pattern comprises a plurality of cylindrical domains that are perpendicularly oriented to a plane of the substrate.

11. The method of claim 8, wherein the pattern comprises a plurality of lamellar domains that are perpendicularly oriented to the plane of the substrate.

12. The method of claim 8, wherein the block copolymer assembly component is a PS-b-PMMA block copolymer.

13. The method of claim 8, wherein the orientation control component further comprises an additional reheat unit.

14. The method of claim 8, wherein the composition comprises at least one additional component selected from the group consisting of:

additional polymers comprising homopolymers, random copolymers, crosslinkable polymers, inorganic-containing polymers, or a combination comprising at least one of the foregoing; and additives comprising inorganic-containing molecules, surfactants, photoacid generators, thermal acid generators, quenchers, hardeners, cross-linkers, chain extenders; or a combination comprising at least one of the foregoing;

wherein one or more of the additional components co-assemble with the block copolymer to form the block copolymer assembly component.

15. The method of claim 9, further comprising transferring the topographical pattern into the underlying substrate.

* * * * *